United States Patent
Usatyuk et al.

(10) Patent No.: US 10,944,425 B2
(45) Date of Patent: Mar. 9, 2021

(54) DEVICES AND METHODS FOR GENERATING A LOW DENSITY PARITY CHECK CODE FOR A INCREMENTAL REDUNDANCY HARQ COMMUNICATION APPARATUS

(71) Applicant: Huawei Technologies Co., Ltd., Shenzhen (CN)

(72) Inventors: Vasily Stanislavovich Usatyuk, Moscow (RU); Nikita Andreevich Polianskii, Moscow (RU); Ilya Viktorovich Vorobyev, Moscow (RU)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/440,666

(22) Filed: Jun. 13, 2019

(65) Prior Publication Data
US 2019/0349003 A1    Nov. 14, 2019

Related U.S. Application Data

(63) Continuation of application No. PCT/RU2016/000869, filed on Dec. 13, 2016.

(51) Int. Cl.
H03M 13/11     (2006.01)
H03M 13/00     (2006.01)
H04L 1/18      (2006.01)

(52) U.S. Cl.
CPC ....... H03M 13/116 (2013.01); H03M 13/616 (2013.01); H03M 13/6306 (2013.01); H04L 1/1812 (2013.01)

(58) Field of Classification Search
CPC ............. H03M 13/116; H03M 13/616; H03M 13/6306; H03M 13/036; H03M 13/6516;
(Continued)

(56) References Cited

U.S. PATENT DOCUMENTS

2006/0156183 A1    7/2006   Kim et al.
2007/0113147 A1    5/2007   Hong et al.
(Continued)

FOREIGN PATENT DOCUMENTS

CN    1783730 A      6/2006
CN    101075811 A    11/2007
(Continued)

OTHER PUBLICATIONS

"LDPC HARQ," 3GPP TSG-RAN WG1 #86, R1-166369, Gothenburg, Sweden, pp. 1-9, 3rd Generation Partnership Project—Valbonne, France (Aug. 22-26, 2016).
(Continued)

*Primary Examiner* — James C Kerveros
(74) *Attorney, Agent, or Firm* — Leydig, Voit & Mayer, Ltd.

(57) ABSTRACT

Devices and methods are disclosed for generating on the basis of a first protograph matrix $P_1$ of size m×n, wherein the first protograph matrix $P_1$ defines a first code $H_1$, a second protograph matrix $P_2$ of size (m+d)×(n+d), wherein the second protograph matrix $P_2$ defines a second code $H_2$. The device comprises a processor configured to: generate an auxiliary protograph matrix P' of size $(m+d_1) \times (n+d_1)$ on the basis of the first protograph matrix $P_1$ using row splitting; generate $d_2$ random integer numbers, wherein $d_2 = d - d_1$; generate a binary matrix M of size $d_2 \times (n-m)$, wherein rows of the binary matrix M are generated on the basis of the $d_2$ random integer numbers; generate a matrix M' by lifting the binary matrix M; Other operation steps are also included.

20 Claims, 11 Drawing Sheets

(58) Field of Classification Search
CPC ... H04L 1/1812; H04L 1/1874; H04L 1/1819; H04L 1/0057
USPC .......................................................... 714/758
See application file for complete search history.

(56) References Cited

U.S. PATENT DOCUMENTS

| | | |
|---|---|---|
| 2007/0162815 A1 | 7/2007 | El-Khamy et al. |
| 2007/0220399 A1 | 9/2007 | Kim et al. |
| 2008/0126916 A1 | 5/2008 | Chung et al. |
| 2010/0115371 A1* | 5/2010 | Shen ................. H04L 1/0057 714/752 |
| 2010/0192037 A1 | 7/2010 | Kuri et al. |
| 2010/0325511 A1 | 12/2010 | Oh et al. |
| 2011/0138260 A1 | 6/2011 | Savin |
| 2011/0239075 A1 | 9/2011 | Xu et al. |
| 2012/0131409 A1 | 5/2012 | Divsalar et al. |
| 2017/0104499 A1* | 4/2017 | Yuan .................. G06F 11/1068 |
| 2017/0109233 A1* | 4/2017 | Ilani .................... H03M 13/611 |

FOREIGN PATENT DOCUMENTS

| | | |
|---|---|---|
| CN | 102088294 A | 6/2011 |
| CN | 103152056 A | 6/2013 |
| WO | 2008069460 A1 | 6/2008 |

OTHER PUBLICATIONS

Xianfeng et al., "Quasi-cycle LDPC Construction Method Based on Protograph Expansion," pp. 1-6, (2012). with English Abstract.

* cited by examiner $$P_1 = \begin{bmatrix} -1 & -1 & 0 \\ -1 & 0 & 0 \\ 0 & 0 & -1 \\ 3 & 8 & 9 \\ 5 & 1 & 4 \\ 7 & 6 & 1 \end{bmatrix}$$

$$P' = \begin{bmatrix} -1 & -1 & -1 & -1 & -1 & 0 \\ -1 & -1 & -1 & -1 & 0 & 0 \\ -1 & -1 & -1 & 0 & 0 & -1 \\ -1 & -1 & 0 & 0 & -1 & -1 \\ -1 & 0 & 0 & -1 & -1 & -1 \\ 0 & 0 & -1 & -1 & -1 & -1 \\ 3 & -1 & 8 & -1 & 9 & -1 \\ -1 & 5 & -1 & 1 & -1 & 4 \\ 7 & -1 & 6 & -1 & 1 & -1 \end{bmatrix}$$

Fig. 6

$$M = \begin{bmatrix} 0 & 1 & 0 \\ 1 & 1 & 1 \\ 1 & 1 & 0 \end{bmatrix}$$

$$M' = \begin{bmatrix} -1 & 6 & -1 \\ 3 & 3 & 5 \\ 8 & 4 & -1 \end{bmatrix}$$

Fig. 7

$$P_2 = \begin{pmatrix}
7 & -1 & 0 & -1 & -1 & -1 & -1 & -1 & -1 & -1 & -1 & -1 \\
-1 & 5 & 3 & 0 & -1 & -1 & -1 & -1 & -1 & -1 & -1 & -1 \\
6 & -1 & 0 & 0 & -1 & -1 & -1 & -1 & -1 & -1 & -1 & -1 \\
-1 & 1 & 8 & -1 & 0 & 0 & -1 & -1 & -1 & -1 & -1 & -1 \\
1 & -1 & -1 & -1 & 0 & 0 & -1 & -1 & -1 & -1 & -1 & -1 \\
-1 & 4 & 9 & -1 & -1 & 0 & 0 & -1 & -1 & -1 & -1 & -1 \\
8 & 3 & -1 & -1 & -1 & -1 & 0 & -1 & -1 & -1 & -1 & -1 \\
4 & 3 & 6 & -1 & -1 & -1 & -1 & 0 & -1 & -1 & -1 & -1 \\
-1 & 5 & -1 & -1 & -1 & -1 & -1 & -1 & 0 & -1 & -1 & -1
\end{pmatrix}$$

M'-part ··· I(3)-raptor part

Fig. 8

DEVICES AND METHODS FOR GENERATING A LOW DENSITY PARITY CHECK CODE FOR A INCREMENTAL REDUNDANCY HARQ COMMUNICATION APPARATUS

CROSS REFERENCE TO RELATED APPLICATIONS

This application is a continuation of International Application No. PCT/RU2016/000869, filed on Dec. 13, 2016, the disclosure of which is hereby incorporated by reference in its entirety.

TECHNICAL FIELD

Generally, the present invention relates to the field of channel coding. More specifically, the present invention relates to devices and methods for generating a code for a communication apparatus as well as a communication apparatus using such a code, in particular in the context of a hybrid automatic repeat request (HARQ) scheme.

BACKGROUND

Hybrid automatic repeat request (HARQ) schemes are used in communication systems to provide both efficient and reliable data transmissions. Incremental redundancy (IR) is an HARQ method of combination of the payloads from different retransmissions. A fixed retransmitted payload is currently used in the LTE system as a baseline.

Some known HARQ schemes are based on matrix-based low density parity check (LDPC). In particular, quasi cyclic low density parity check (QC-LDPC) codes can have a compact specification due to the fact that they can be defined by means of protograph matrices and circulant matrices.

US20110239075 discloses a channel coding, modulating and mapping method for a HARQ scheme based on a LDPC. A uniform matrix H is considered for different code lengths. Modular or floor lifting is used to obtain a matrix with a new size of the circulant. Moreover, a constellation rearrangement strategy is disclosed, where high-order bits are mapped to reliable points in the constellation. However, this scheme is an offline HARQ scheme, wherein bits which are sent more than once are mapped to lower reliable bits in points of the constellation.

US2011138260 discloses a row-splitting scheme to obtain the matrix for the second retransmission of the HARQ scheme. Some rows are split and some new columns are added. The splitting degree may be different for different rows.

Using low-rate codes and transmitting different sets of parity bits at different transmissions are disclosed, for instance, in US2007113147, US2010192037 and US2007220399. US2007113147 suggests arranging transmitted parity bits at regular intervals. In US2010192037 the transmission order of parity bits is based on their column degree. In US2007220399 the order of transmission is based on the notion of k-step recoverable nodes.

Although the conventional approaches described above already provide some improvements compared to other prior art approaches, there is still a need for improved devices and methods for generating a code for a HARQ communication apparatus.

SUMMARY

It is an object of some of the embodiments of the invention to provide for improved devices and methods for generating a code for a HARQ communication apparatus.

The foregoing and other objects are achieved by the subject matter of the independent claims. Further implementation forms are apparent from the dependent claims, the description and the figures.

According to a first aspect, the embodiments of the invention relates to a device for generating on the basis of a first protograph matrix $P_1$ of size m×n, wherein the first protograph matrix $P_1$ defines a first code $H_1$, a second protograph matrix $P_2$ of size (m+d)×(n+d), wherein the second protograph matrix $P_2$ defines a second code $H_2$. The device comprises a processor configured to generate an auxiliary protograph matrix P' of size $(m+d_1) \times (n+d_1)$ on the basis of the first protograph matrix $P_1$ using row splitting, generate $d_2$ random integer numbers, wherein $d_2=d-d_1$, generate a binary matrix M of size $d_2 \times (n-m)$, wherein rows of the binary matrix M are generated on the basis of the $d_2$ random integer numbers, generate a matrix M by lifting the binary matrix M, generate a matrix I of size $d_2 \times d_2$, wherein the matrix I has zero circulant shifts as diagonal elements and empty circulant shifts as non-diagonal elements, generate a matrix $C_1$ of size $(m+d_1) \times d_2$ and a matrix $C_2$ of size $d_2 \times (m+d_1)$, wherein the matrix $C_1$ and the matrix $C_2$ comprise only empty circulant shifts, and generate the second protograph matrix $P_2$ on the basis of the auxiliary protograph matrix P', the matrix M', the matrix I, the matrix $C_1$ and the matrix $C_2$, wherein the second protograph matrix $P_2$ comprises row weights equal to one of the $d_2$ random integer numbers.

In a first possible implementation form of the device according to the first aspect as such, the processor is further configured to generate the $d_2$ random integer numbers on the basis of a mean row weight $\lambda$ of the auxiliary protograph matrix P', wherein the mean row weight $\lambda$ is defined as a ratio of the number of nonempty circulants of the auxiliary matrix P' to $m+d_1$.

In a second possible implementation form the device according to the first implementation form of the first aspect, the processor is further configured to generate the $d_2$ random integer numbers on the basis of a Poisson distribution having a mean value $\lambda$.

In a third possible implementation form of the device according to the first aspect as such, the first or the second implementation form thereof, the auxiliary protograph matrix P' has a circulant size z and the processor is further configured to generate at most z random circulant shifts on the basis of a seed, wherein the z random circulant shifts have integer values lower than z or equal to z.

In a fourth possible implementation form of the device according to the third implementation form of the first aspect, the processor is further configured to lift the binary matrix M by replacing elements of the binary matrix M equal to 1 by one of the z random circulant shifts and by replacing the elements of the binary matrix M equal to 0 by −1.

In a fifth possible implementation form of the device according to the first aspect as such, or any one of the first to fourth implementation form thereof, the processor is further configured to set the elements $(1:m+d_1, 1:n+d_1)$ of the second protograph matrix $P_2$ equal to the corresponding elements of the auxiliary protograph matrix P'.

In a sixth possible implementation form of the device according to the first aspect as such, or any one of the first to fifth implementation form thereof, the processor is further configured to set the elements $(1:m+d_1, n+d_1+1:n+d)$ of the second protograph matrix $P_2$ equal to the corresponding elements of the matrix $C_1$.

In a seventh possible implementation form of the device according to the first aspect as such, or any one of the first to sixth implementation form thereof, the processor is further configured to set the elements $(m+d_1+1:m+d, 1:n-m)$ of the second protograph matrix $P_2$ equal to the corresponding elements of the matrix M'.

In an eighth possible implementation form of the device according to the first aspect as such, or any one of the first to seventh implementation form thereof, the processor is further configured to set the elements $(m+d_1+1:m+d, n-m+1:n+d_1)$ of the second protograph matrix $P_2$ equal to the corresponding elements of the matrix $C_2$.

In a ninth possible implementation form of the device according to the first aspect as such, or any one of the first to eighth implementation form thereof, the processor is further configured to set the elements $(m+d_1+1:m+d, n+d_1+1:n+d)$ of the second protograph matrix $P_2$ equal to the corresponding elements of the matrix I.

In a tenth possible implementation form of the device according to the first aspect as such, or any one of the first to ninth implementation form thereof, the first protograph matrix $P_1$ and/or the auxiliary protograph matrix P' and/or the second protograph matrix $P_2$ have the same circulant size.

According to a second aspect the embodiments of the invention relates to a communication apparatus comprising a channel encoder comprising a device for generating a protograph matrix according to the first aspect as such or any one of the first to tenth implementation form thereof.

According to a third aspect the embodiments of the invention relates to a communication apparatus comprising a channel encoder comprising a first protograph matrix $P_1$ or a corresponding first code $H_1$ and a second protograph matrix $P_2$ or a corresponding second code $H_2$, wherein the channel encoder is configured to use the first code $H_1$ for a first transmission of a HARQ scheme and the second code $H_2$ for a retransmission of the HARQ scheme and wherein the first protograph matrix $P_1$ or the corresponding first code $H_1$ and the second protograph matrix $P_2$ or the corresponding second code $H_2$ have been provided by a device for generating a protograph matrix according to the first aspect as such or any one of the first to tenth implementation form thereof.

According to a fourth aspect the embodiments of the invention relates to a method for generating on the basis of a first protograph matrix $P_1$ of size m×n, wherein the first protograph matrix $P_1$ defines a first code $H_1$, a second protograph matrix $P_2$ of size $(m+d)\times(n+d)$, wherein the second protograph matrix $P_2$ defines a second code $H_2$. The method comprises the steps of: generating an auxiliary protograph matrix P of size $(m+d_1)\times(n+d_1)$ on the basis of the first protograph matrix $P_1$ using row splitting, generating $d_2$ random integer numbers, wherein $d_2=d-d_1$, generating a binary matrix M of size $d_2\times(n-m)$, wherein rows of the binary matrix M are generated on the basis of the $d_2$ random integer numbers, generating a matrix M' by lifting the binary matrix M, generating a matrix I of size $d_2\times d_2$, wherein the matrix/has zero circulant shifts as diagonal elements and empty circulant shifts as non-diagonal elements, generating a matrix $C_1$ of size $(m+d_1)\times d_2$ and a matrix $C_2$ of size $d_2\times(m+d_1)$, wherein the matrix $C_1$ and the matrix $C_2$ comprise only empty circulant shifts, and generating the second protograph matrix $P_2$ on the basis of the auxiliary protograph matrix P', the matrix M', the matrix I, the matrix $C_1$ and the matrix $C_2$, wherein the second protograph matrix $P_2$ comprises row weights equal to one of the $d_2$ random integer numbers.

In a first possible implementation form of the method according to the fourth aspect as such, the method further comprises the step of: setting the elements $(1:m+d1, 1:n+d1)$ of the second protograph matrix $P_2$ equal to the corresponding elements of the auxiliary matrix P'.

In a second possible implementation form of the method according to the fourth aspect as such or the first implementation form thereof, the method further comprises the step of:
setting the elements $(1:m+d_1, n+d_1+1:n+d)$ of the second protograph matrix $P_2$ equal to the corresponding elements of the matrix $C_1$.

In a third possible implementation form of the method according to the fourth aspect as such, the first or the second implementation form thereof, the method further comprises the step of: setting the elements $(m+d_1+1:m+d, 1:n-m)$ of the second protograph matrix $P_2$ equal to the corresponding elements of the matrix M.

In a fourth possible implementation form of the method according to the fourth aspect as such or any one of the first to third implementation form thereof, the method further comprises the step of: setting the elements $(m+d_1+1:m+d, n-m+1:n+d_1)$ of the second protograph matrix $P_2$ equal to the corresponding elements of the matrix $C_2$.

In a fifth possible implementation form of the method according to the fourth aspect as such or any one of the first to fourth implementation form thereof, the method further comprises the step of: setting the elements $(m+d_1+1:m+d, n+d_1+1:n+d)$ of the second protograph matrix $P_2$ equal to the corresponding elements of the matrix I.

According to a fifth aspect, the embodiments of the invention relates to a computer program comprising a program code for performing the method according to the fourth aspect as such or any one of the first to fifth possible implementation form thereof when executed on a computer.

The invention can be implemented in hardware and/or software.

BRIEF DESCRIPTION OF DRAWINGS

Further embodiments of the invention will be described with respect to the following figures, wherein:

FIG. 6 shows a schematic diagram illustrating a first protograph matrix and an auxiliary protograph matrix generated by a device for generating a code according to an embodiment;

FIG. 7 shows a schematic diagram illustrating a binary matrix and a lifted matrix generated by a device for generating a code according to an embodiment;

FIG. 8 shows a schematic diagram illustrating a second matrix generated by a device for generating a code according to an embodiment;

In the various figures, identical reference signs will be used for identical or at least functionally equivalent features.

DESCRIPTION OF EMBODIMENTS

In the following description, reference is made to the accompanying drawings, which form part of the disclosure, and in which are shown, by way of illustration, specific aspects in which the present invention may be placed. It is understood that other aspects may be utilized and structural or logical changes may be made without departing from the scope of the present invention. The following detailed description, therefore, is not to be taken in a limiting sense, as the scope of the present invention is defined by the appended claims.

For instance, it is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

Figure 1:
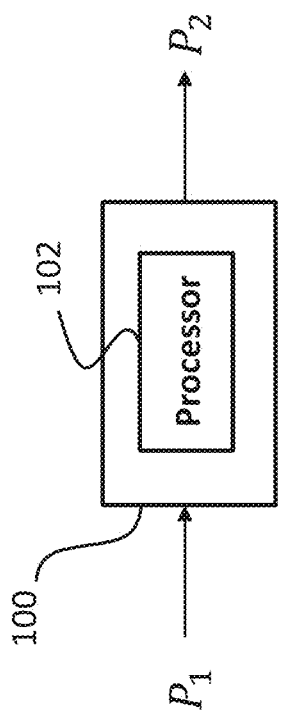
FIG. 1 shows a schematic diagram illustrating a device for generating a code for a HARQ communication apparatus according to an embodiment.
Figure 2:
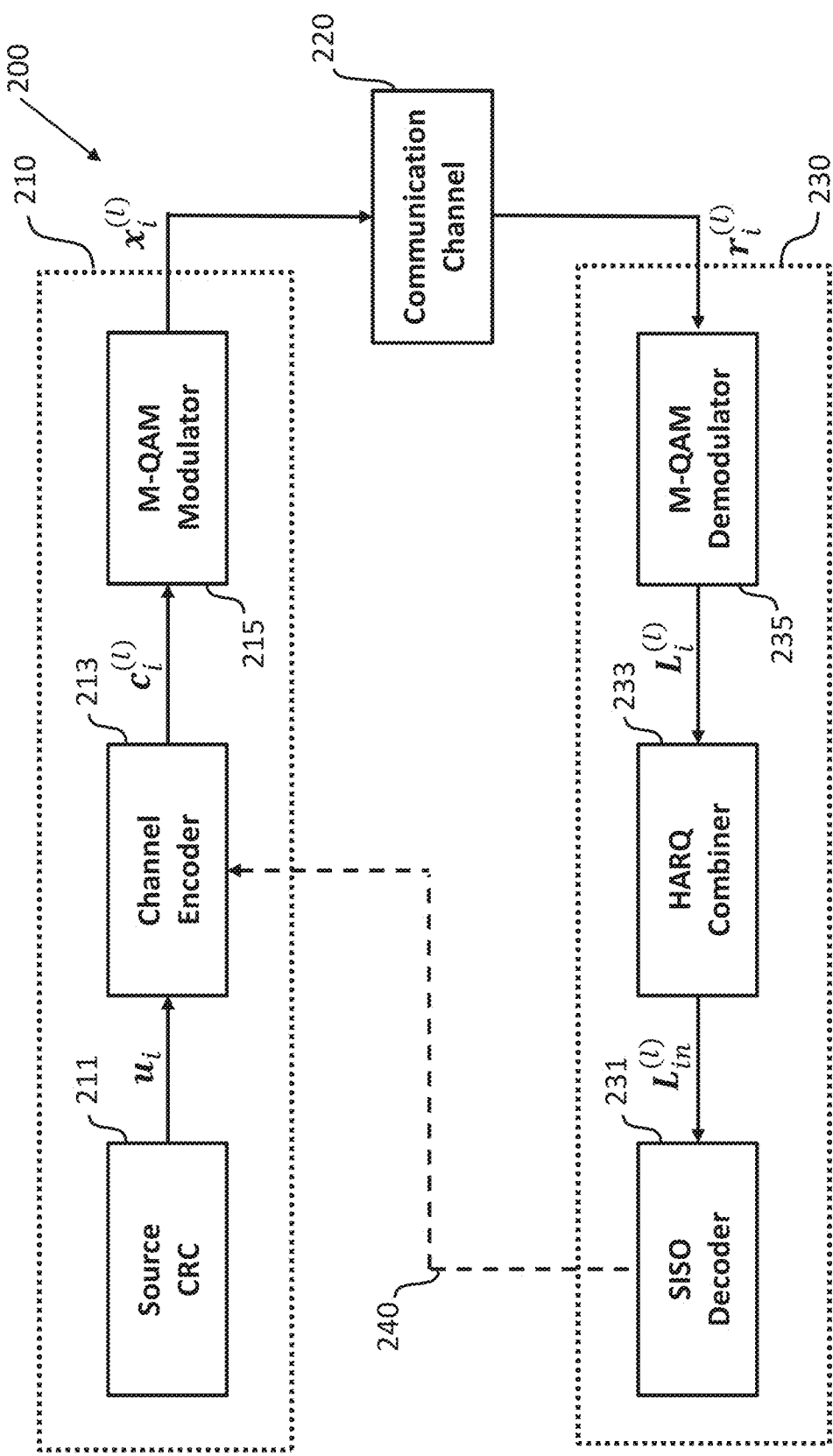
FIG. 2 shows a schematic diagram illustrating a communication system comprising a HARQ communication apparatus according to an embodiment.

FIG. 1 shows a schematic diagram illustrating a device 100 for generating a code for a HARQ communication apparatus, for instance, the HARQ communication apparatus 210 of the communication system 200 shown in FIG. 2.

Before describing the device 100 shown in FIG. 1 and the HARQ communication apparatus 210 shown in FIG. 2 in more detail, the following definitions and notation will be introduced. Let P be a m×n protograph matrix and z its circulant size, specifically, $$P = \begin{matrix} p_{1,1} & p_{1,2} & \ldots & p_{1,n-1} & p_{1,n} \\ p_{2,1} & p_{2,2} & \ldots & p_{2,n-1} & p_{2,n} \\ \ldots & \ldots & \ldots & \ldots & \ldots \\ p_{m-1,1} & p_{m-1,2} & \ldots & p_{m-1,n-1} & p_{m-1,n} \\ p_{m,1} & p_{m,2} & \ldots & p_{m,n-1} & p_{m,n} \end{matrix}$$

such that $-1 \leq p_{i,j} \leq z-1$.

An LDPC code, in particular a QC-LDPC code, of length n·z corresponding to the protograph matrix P is defined by the (m·z)×(n·z) parity-check base matrix H:

$$H = H(P) = \begin{matrix} A_{1,1} & A_{1,2} & \ldots & A_{1,n-1} & A_{1,n} \\ A_{2,1} & A_{2,2} & \ldots & A_{2,n-1} & A_{2,n} \\ \ldots & \ldots & \ldots & \ldots & \ldots \\ A_{m-1,1} & A_{m-1,2} & \ldots & A_{m-1,n-1} & A_{m-1,n} \\ A_{m,1} & A_{m,2} & \ldots & A_{m,n-1} & A_{m,n} \end{matrix}$$

wherein the circulant permutation matrix (CPM) $A_{i,j}$ represents either the z×z zero matrix Z, if $p_{i,j}=-1$, or the z×z circulant permutation matrix $I(p_{i,j})$ obtained by cyclically right-shifting the z×z identity matrix I(0) by positions. The integers $p_{i,j}$ are usually called circulant shifts. If $p_{i,j}=-1$, then $p_{i,j}$ is called an empty circulant shift. If $p_{i,j}=0$, then $p_{i,j}$ is called a zero circulant shift.

In embodiments of the invention, H represents a first LDPC code, in particular a first QC-LDPC code, which can be used for the first transmission of a HARQ scheme, in particular of an incremental redundancy (IR) HARQ scheme. In embodiments of the invention, the protograph matrix P is a repeat accumulate (RA) protograph matrix, which can be beneficial in communication systems, because the corresponding parity-check matrix has easy-encoding properties:

|   |       | $i_1$ | $i_2$ | ... | $i_{n-m}$ | $p_1$ | $p_2$ | ... | $p_{m-1}$ | $p_m$ |
|---|-------|-------|-------|-----|-----------|-------|-------|-----|-----------|-------|
| P= | $r_1$ | $p_{1,1}$ | $p_{1,2}$ | ... | $p_{1,n-m}$ | 0 | -1 | ... | -1 | -1 |
|   | $r_2$ | $p_{2,1}$ | $p_{2,2}$ | ... | $p_{2,n-m}$ | 0 | 0 | ... | -1 | -1 |
|   | $r_3$ | ... | ... | ...... | ......... | ... | ... |
|   | $r_4$ | $p_{m-1,1}$ | $p_{m-1,2}$ | ... | $p_{m-1,n-m}$ | -1 | -1 | ... | 0 | -1 |
|   | $r_5$ | $p_{m,1}$ | $p_{m,2}$ | ... | $p_{m,n-m}$ | -1 | -1 | ... | 0 | 0 |

In the above exemplary representation of the protograph matrix P, the first row has been included for clarity to indicate which bits are either information bits or parity bits. The first column has been included to identify the row. As already described above, each m×1 column of P corresponds to a m·(z×z) submatrix of H(P), specifically, $i_j$ corresponds to a group of z information bits as well as $p_j$.

In other embodiments of the invention, the protograph matrix P is a repeat accumulate (RA), an extended irregular repeat-accumulate (eIRA) protograph matrix or a multi-edge protograph matrix.

The device 100 in FIG. 1 for generating a code for the HARQ communication apparatus 210 comprises a processor 102. The processor 102 of the device 100 is configured to generate on the basis of a first protograph matrix $P_1$ of size m×n, wherein the first protograph matrix $P_1$ defines a first code $H_1$, a second protograph matrix $P_2$ of size (m+d)×(n+d), wherein the second protograph matrix $P_2$ defines a second code $H_2$.

In a first stage, the processor 102 of the device 100 is configured to generate an auxiliary protograph matrix P' of size $(m+d_1)\times(n+d_1)$ on the basis of the first protograph matrix $P_1$ using row splitting.

In a second stage, the processor 102 of the device 100 is configured to generate $d_2$ random integer numbers, wherein $d_2 = d - d_1$.

In a third stage, the processor 102 of the device 100 is configured to generate a binary matrix M of size $d_2 \times (n-m)$, wherein rows of the binary matrix M are generated on the basis of the $d_2$ random integer numbers.

In a fourth stage, the processor 102 of the device 100 is configured to generate a matrix M' by lifting the binary matrix M.

In a fifth stage, the processor 102 of the device 100 is configured to generate a matrix I of size $d_2 \times d_2$, wherein the matrix I has zero circulant shifts as diagonal elements and empty circulant shifts as non-diagonal elements.

In a sixth stage, the processor 102 of the device 100 is configured to generate a matrix $C_1$ of size $(m+d_1) \times d_2$ and a matrix $C_2$ of size $d_2 \times (m+d_1)$, wherein the matrix $C_1$ and the matrix $C_2$ comprise only empty circulant shifts; and In a seventh stage, the processor 102 of the device 100 is configured to generate the second protograph matrix $P_2$ on the basis of the auxiliary protograph matrix P', the matrix M', the matrix I, the matrix $C_1$ and the matrix $C_2$, wherein the second protograph matrix $P_2$ comprises row weights equal to one of the $d_2$ random integer numbers.

The first protograph matrix $P_1$ and/or the corresponding first code $H_1$ and the second protograph matrix $P_2$ and/or the corresponding second code $H_2$ as described above can be beneficially used in a HARQ scheme. In an embodiment, the first protograph matrix $P_1$ and/or the corresponding first code $H_1$ and the second protograph matrix $P_2$ and/or the corresponding second code $H_2$ are implemented in the communication apparatus 210 of the communication system 200 shown in FIG. 2.

In an embodiment, the communication system 200 shown in FIG. 2 implements a reliability based HARQ (RB-HARQ) scheme. The communication system 200 comprises the transmitting communication apparatus 210 and the receiving communication apparatus 230. In an embodiment, the transmitting communication apparatus 210 and the receiving communication apparatus 230 could be a base station, a user equipment or the like.

A binary information sequence with attached cyclic redundancy check (CRC) code bits of overall length K denoted as $u=(u(1), u(2), \ldots u(K))$ is provided by a source 211 of the communication apparatus 210. After channel encoding by the channel encoder 213 for a transmission 1, a binary code sequence $c^{(l)}=(c^l(1), c^l(2), \ldots, c^l(N_l))$ is obtained, wherein $N_l$ denotes the number of code bits for the l-th transmission. The modulator 215 maps this sequence to a M-QAM modulated sequence $x^{(l)}$. After passing through the communication channel 220, e.g. a fully interleaved Rayleigh channel, one obtains $r^{(l)}$, i.e. the vector of received complex symbols:

$$r_i^{(l)} = h_i^{(l)} \cdot x_i^{(l)} + n_i^{(l)},$$

wherein $h_i^{(l)}$ denotes the Rayleigh fading channel coefficient with zero mean and unit variance and $n_i^{(l)}$ denotes the complex Gaussian noise with variance $2 \cdot \sigma_l^2$.

The M-QAM demodulator 235 of the communication apparatus 230 can calculate channel log-likelihood ratios (LLRs) L, which can be implemented in a Max-Log-MAP (maximum a posteriori) fashion:

$$L_{i,k}^{(l)} = \max_{\theta_j \in A: \theta_{j,k}=1} \log F(r_i^{(l)}, \hat{h}_i^{(l)}, \hat{\sigma}_l, \theta_j) - \max_{\theta_j \in A: \theta_{j,k}=0} \log F(r_i^{(l)}, \hat{h}_i^{(l)}, \hat{\sigma}_l, \theta_j),$$

wherein $$\log F(r_i^{(l)}, \hat{h}_i^{(l)}, \hat{\sigma}_l, \theta_j) = -\frac{\|r_i^{(l)} - \hat{h}_i^{(l)} \cdot \theta_j\|^2}{2 \cdot \hat{\sigma}_l^2},$$

wherein $\hat{h}_i^{(l)}$ and $\hat{\sigma}_l^2$ are estimations of a fading coefficient and of a noise variance respectively, A-constellation points of M-QAM, $k=1, \ldots, \log_2 M$.

Thereafter, the HARQ combiner 233 follows, where input LLRs are summed at code positions that were previously sent (chase combining) and LLRs for new parity bits are just concatenated to form one codeword (incremental redundancy). This codeword is provided to the soft input soft output (SISO) channel decoder 231 of the communication apparatus 230. This channel decoder 231 can be implemented as a turbo, LDPC or convolutional code decoder. So, $L_{in}^{(l)}$ corresponds to input LLRs of the SISO decoder 231 at the l-th transmission and $L_{out}^{(l)}$—soft output LLRs of the decoder 231. Generally, RB-HARQ algorithms take $L_{out}^{(l)}$ and, in case of decoding failure (CRC fails), try to determine which bits should be retransmitted and signal it in the feedback channel 240.

Figure 3:
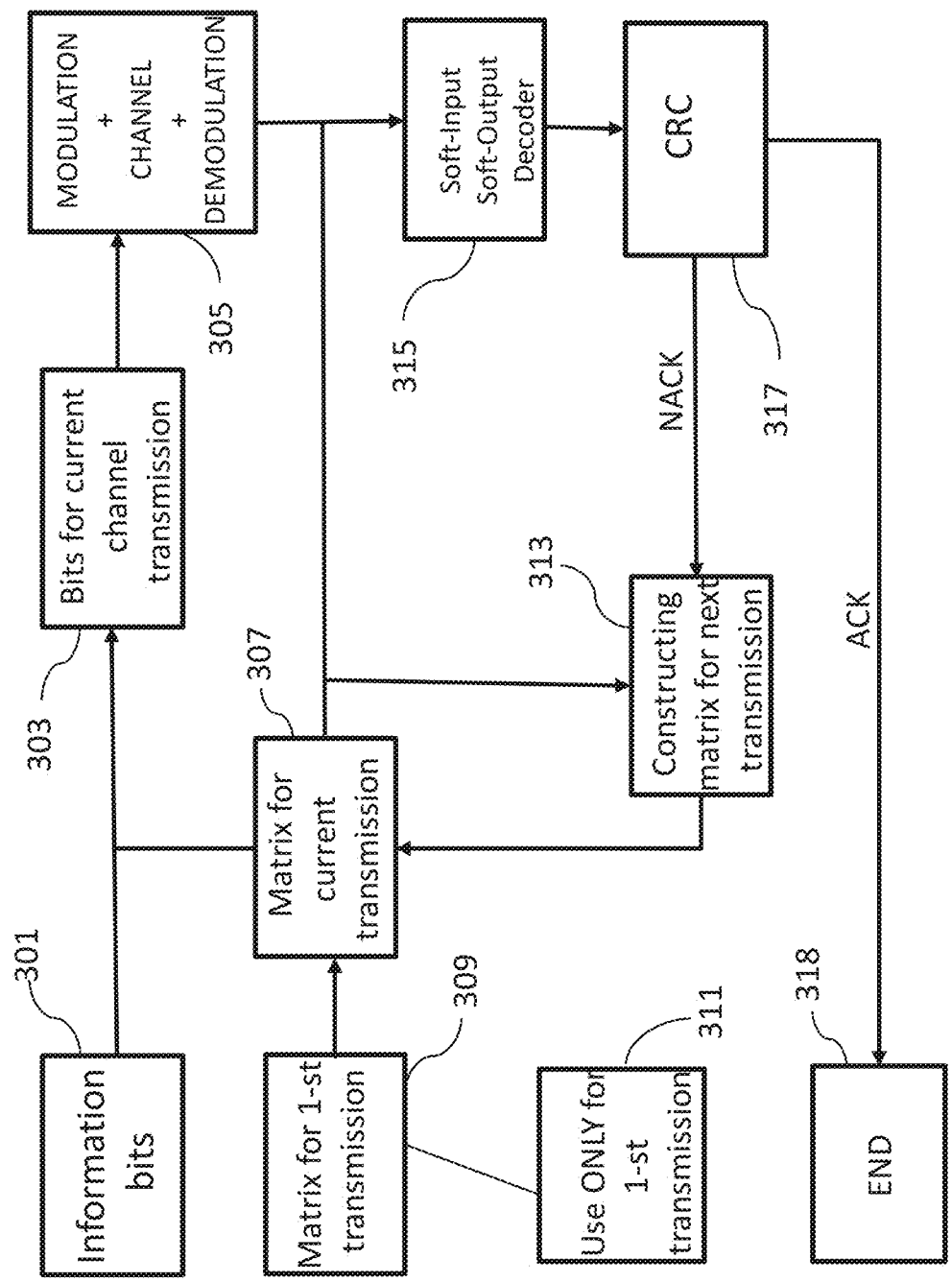
FIG. 3 shows a schematic diagram illustrating some steps for a transmission in a HARQ communication apparatus according an embodiment.

In an embodiment, the communication system 200 shown in FIG. 2 can be configured to perform the steps illustrated in FIG. 3, which define a first stage of a HARQ scheme with $K \geq 2$ possible steps. Let $n_i$ be the number of columns of a protograph matrix $P_i$, $n=n_1$, $n_{i+1} > n_i$. In the case of incremental redundancy, $n_i = i \cdot n$.

Let the circulant size be denoted by z and let the information bits (block 301) with attached CRC be denoted by u. Then, by encoding u by means of an LDPC code $H(P_1)$, the codeword $c_1$ of length $n_1 \cdot z$ for a current channel transmission (block 303) can be obtained, wherein $P_1$ is a protograph matrix of the first transmission (block 309), which can be used for the first transmission (block 311). After modulation of the codeword, the passage of the codeword through the communication channel 220, and the demodulation of the received signal (block 305), a soft information $L_1$ consisting of LLR's corresponding to the bits of $c_1$ can be obtained. Then, $L_1$ can be decoded (block 315) by means of a parity-check matrix. After decoding, the CRC can be checked (block 317). If the information is confirmed, then the correct information bits have been received (block 318). Otherwise, the next stage with iter=2 can be performed.

In the next stage, the protograph matrix $P_{iter}$ for a next transmission is constructed (block 313). Then, u is encoded using a LDPC code $H(P_{iter})$ and a codeword $c_{iter}$ of length $n_{iter} \cdot z$ is obtained (block 303). Since $c_{iter}$ contains $c_{iter-1}$ as a subword, only the remaining part of $c_{iter}$ is transmitted, this means $c_{iter} \backslash c_{iter-1}$ is transmitted. After modulation of the codeword, the passage of the codeword through the communication channel 220, and the demodulation of the received signal (block 305), the soft information $L'_{iter}$ consisting of LLR's corresponding to bits of $c_{iter} \backslash c_{iter-1}$ can be obtained. Then, the soft information $L_{iter-1}$ and $L'_{iter}$ can be combined into $L_{iter}$ (in an embodiment, this is just a concatenation into vector of length $n_{iter} \cdot z$). By means of the parity-check matrix, $L_{iter}$ can be decoded (block 315). After decoding, the CRC can be checked (block 317). If the information is confirmed, then the correct information bits have been received (block 318). Otherwise, if iter<K, the above next stage with iter=iter+1 can be repeated.

Figure 4:
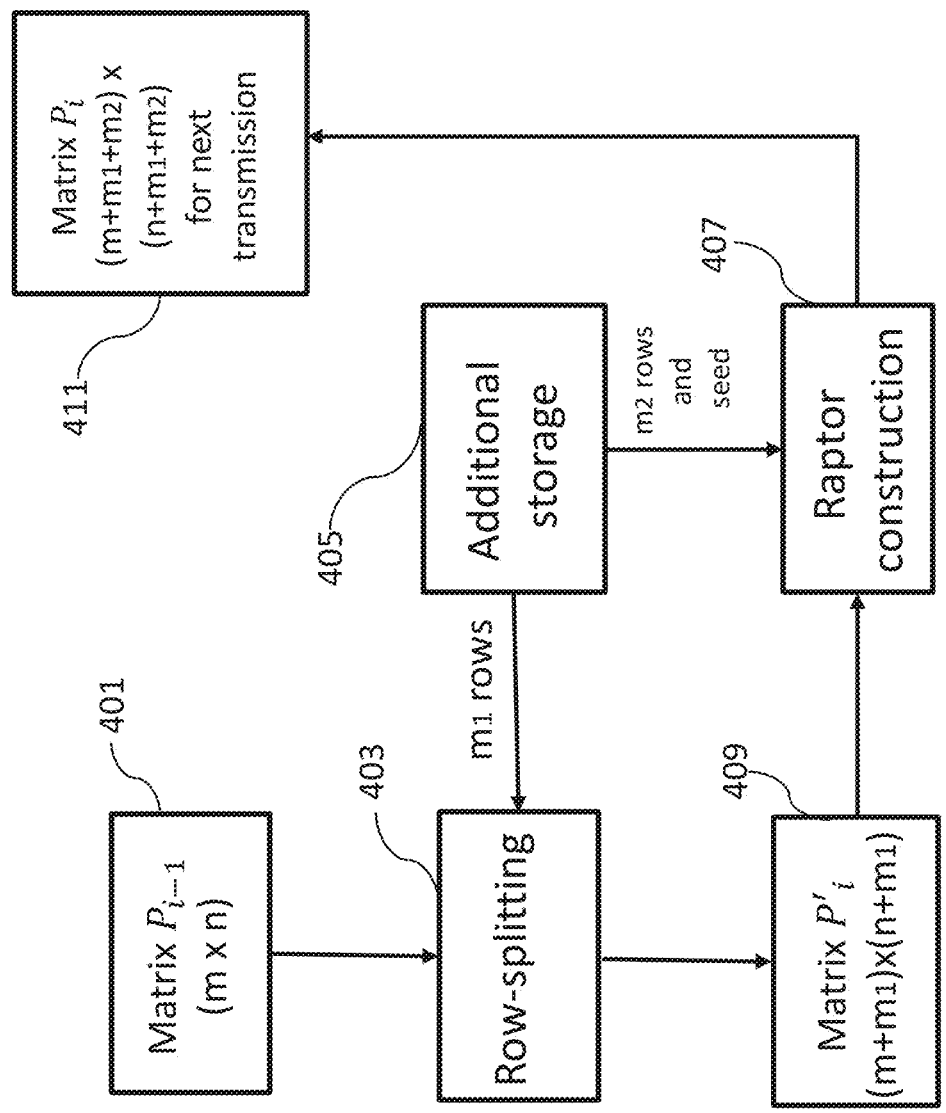
FIG. 4 shows a schematic diagram illustrating some steps of an algorithm for generating a matrix by a device for generating a code according to an embodiment.

FIG. 4 shows a schematic diagram illustrating some steps of an algorithm for generating a matrix by the device 100 for generating a code according to an embodiment. In particular, in this embodiment, some steps of an algorithm for generating a protograph matrix $P_i$ (block 411) used for generating a QC LDPC code $H_2 = H(P_i)$ of a next transmission on the basis of a protograph matrix $P_{i-1}$ (block 401) used for generating a code $H_1 = H(P_{i-1})$ in a previous transmission are illustrated. The QC-LDPC code $H_2$ has a length $(n+m)z$, wherein z is a circulant size of the protograph matrix $P_i$, while the QC-LDPC code $H_1$ has a length nz such that the code $H_1$ is a subcode of the code $H_2$.

Moreover, some predefined parameters can be stored in a memory 405, which are used in a first row-splitting (RS) algorithm (block 403) and in a second algorithm, which is herein referred to as raptor-like construction (RLC) algorithm (block 407).

In a first step, the protograph matrix $P_{i-1}$ of size m×n (block 401) is used as input in the row-splitting (RS) algorithm (block 403) in order to obtain the auxiliary protograph matrix $P'_i$ (block 409) according to the following relation:

$$P'_i = RS(P_{i-1}, m_1)$$

wherein the auxiliary protograph matrix $P'_i$ (block 409) has $m_1$ more rows and columns than the protograph matrix $P_{i-1}$ (block 401), and wherein $m_1$ is stored in the additional storage unit 405.

In a next step, the auxiliary protograph matrix $P'_i$ of size $(m+m_1) \times (n+m_1)$ (block 409) is used as input for the raptor like construction (RLC) algorithm (block 407) in order to obtain the protograph matrix $P_i$ of size $(m+m_1+m_2) \times (n+m_1+m_2)$ (block 411) for the next transmission according to the following relation:

$$P_i = RLC(P'_i, m_2, \text{seed})$$

wherein $m_2$ corresponds to the number of additional rows and columns of $P_i$ compared to $P'_i$ and seed is a seed used in a pseudorandom algorithm. The input parameters $m_1$, $m_2$ and seed can be stored in the additional storage unit 405. In embodiments of the invention, the parameters $m_1$, $m_2$ and seed can be calculated offline and can be chosen in such a way that the HARQ scheme with these parameters provides the best performance among all possible parameters.

In general, in order to obtain a protograph matrix $P_i$ of size $(m+d) \times (n+d)$, first $i-2$ similar steps can be performed in order to get the protograph matrix $P_{i-1}$ of size $m \times n$, and, then, the following steps can be performed:

$$P'_i = RS(P_{i-1}, d_i)$$

$$P_i = RLC(P'_i, d-d_i, \text{seed}_i),$$

wherein $P'_i$ is a protograph matrix of size $(m+d_i) \times (n+d_i)$ and $\text{seed}_i$ is a seed used to generate $d-d_i$ random numbers.

In general, the algorithm used to generate protograph matrices used in HARQ schemes has as input a $P_1$ protograph matrix of size $m \times n$, a number K of maximum HARQ transmissions, a set of seeds $\{\text{seed}_2, \text{seed}_3, \ldots, \text{seed}_K\}$, and a set of integers $\{d_2, d_3, \ldots, d_K\}$, wherein $d_j \leq n$, and as output a set of K protograph matrices $P_1, \ldots, P_K$, corresponding to each transmission according to the HARQ scheme, wherein the sizes of $P_i$ is $(m+\Sigma_{j=2}^{i}d_j) \times (n+\Sigma_{j=2}^{i}d_j)$.

As already described above, in embodiments of the invention, the RS algorithm can be used by the device 100 to generate the auxiliary protograph matrix P'. In an embodiment, the processor 102 of the device 100 is configured to generate the auxiliary protograph matrix P' of size $(m+d_1) \times (n+d_1)$ with circulant size z on the basis of the first protograph matrix $P_1$ of size $m \times n$ with circulant size z using the following RS algorithm. In an embodiment, the first protograph matrix $P_1$ and/or the auxiliary protograph matrix P are repeat accumulate (RA) matrices. In an embodiment, further input parameters for the RS algorithm are the integer number $d_1$, and an option $O \in \{A, B\}$, wherein the options A and B allow to control regularity or irregularity of the obtained QC-LDPC code H(P').

In a first step of the RS algorithm, a $m \times 1$ vector RowWeight is defined, such that RowWeight(i) is equal to the number $p_{i,j} \neq -1$, $1 \leq j \leq n-m$.

In a further step of the RS algorithm, an integer Weight=$\Sigma_{i=1}^{m}$RowWeight(i) is defined.

In a further step of the RS algorithm, it is checked whether Weight<$m+d_1$, and, if this is the case, the RS algorithm will be terminated.

If O=A, then a $m \times 1$ vector splittingFactors is defined, such that splittingFactors(i)$\leq$RowWeight(i), and all values of splittingFactors are close (may be equal) to each other, and $\Sigma$ splittingFactors(i)=$m+d_1$.

If O=B, then a $m \times 1$ vector splittingFactors is defined, such that splittingFactors(i)$\leq$RowWeight(i) and all values given by $$\frac{splittingFactors(i)}{RowWeight(i)}$$

are close (may be equal) to each other, and $\Sigma$ splittingFactors (i)=$m+d_1$.

In particular, the vector splittingFactors(i) determines how many rows will appear in the auxiliary protograph matrix P' instead of the i-th row of the first protograph matrix $P_1$.

The auxiliary protograph matrix P' consists of m submatrices P'(i)

$$P' = \begin{matrix} P'(1) \\ P'(2) \\ \ldots \\ \ldots \\ P'(m) \end{matrix}$$

The submatrix P'(i) is obtained by splitting the i-th row of the first protograph matrix $P_1$ and by adding some new columns in the way, as expressed by the following pseudo code.

```
P ' (i) is predetermined as a (splittingFactor(i)) × (n + d₁) matrix
    of −1's
Residue = 0;
For any j ∈ [n − m]
    If P(i, j) == −1
        Continue;
    End If
    Residue = Residue + 1;
        Residue = mod(Residue, splittingFactor(i));
        P ' (i, Residue) = P(i, j);
    End For
        begPos(i) = n − m + Σₖ₌₁ⁱ⁻¹ splittingFactor(k)      ;
Insert in P ' (i, begPos(i) + 1: begPos(i) + splittingFactor(i)) a
(splittingFactor(i)) ×
splittingFactor(i))) matrix representing a RA part of LDPC code;
    End For
```

The auxiliary protograph matrix P' generated in the way described above has an RA part, so that easy (linear-time) encoding can be performed. The general RS approach described above will be further illustrated on the basis of the following exemplary first protograph matrix $P_1$ with circulant size 5:

|  |  | $i_1$ | $i_2$ | $i_3$ | $p_1$ | $p_2$ | $p_3$ |
|---|---|---|---|---|---|---|---|
| $P_1=$ | $r_1$ | 2 | 4 | 1 | 0 | −1 | −1 |
|  | $r_2$ | 1 | −1 | 3 | 0 | 0 | −1 |
|  | $r_3$ | 3 | 1 | 2 | −1 | 0 | 0 |

Input: $P_1$ and $d_1=4$;
1) RowWeight=$(3,2,3)^T$;
2) Weight=3+3+3=8;
3) Check 8>7;
4) A) splittingFactor=$(2,2,3)^T$;
B) splittingFactor=$(3, 1, 3)^T$;
For option A:

|  |  | $i_1$ | $i_2$ | $i_3$ | $p_1$ | $p_2$ | $p_3$ | $p_4$ | $p_5$ | $p_6$ | $p_7$ |
|---|---|---|---|---|---|---|---|---|---|---|---|
| P'= | $r_{11}$ | 2 | −1 | 1 | 0 | −1 | −1 | −1 | −1 | −1 | −1 |
|  | $r_{12}$ | −1 | 4 | −1 | 0 | 0 | −1 | −1 | −1 | −1 | −1 |
|  | $r_{21}$ | 1 | −1 | −1 | −1 | 0 | 0 | −1 | −1 | −1 | −1 |
|  | $r_{22}$ | −1 | −1 | 3 | −1 | −1 | 0 | 0 | −1 | −1 | −1 |
|  | $r_{31}$ | 3 | −1 | −1 | −1 | −1 | −1 | 0 | 0 | −1 | −1 |
|  | $r_{32}$ | −1 | 1 | −1 | −1 | −1 | −1 | −1 | 0 | 0 | −1 |
|  | $r_{33}$ | −1 | −1 | 2 | −1 | −1 | −1 | −1 | −1 | 0 | 0 |

Rows $r_{11}$ and $r_{12}$ of the auxiliary protograph matrix P' are based on row $r_1$ of the first protograph matrix $P_1$. Rows $r_{21}$ and $r_{22}$ of the auxiliary protograph matrix P' are based on row $r_2$ of the first protograph matrix $P_1$. The rows $r_{31}, r_{32}$ and $r_{33}$ of the auxiliary matrix P' are based on the row $r_3$ of the first protograph matrix $P_1$.

For option B:

|     |          | $i_1$ | $i_2$ | $i_3$ | $p_1$ | $p_2$ | $p_3$ | $p_4$ | $p_5$ | $p_6$ | $p_7$ |
|-----|----------|-------|-------|-------|-------|-------|-------|-------|-------|-------|-------|
| P'= | $r_{11}$ | 2     | -1    | -1    | 0     | -1    | -1    | -1    | -1    | -1    | -1    |
|     | $r_{12}$ | -1    | 4     | -1    | 0     | 0     | -1    | -1    | -1    | -1    | -1    |
|     | $r_{13}$ | -1    | -1    | 1     | -1    | 0     | 0     | -1    | -1    | -1    | -1    |
|     | $r_{21}$ | 1     | -1    | 3     | -1    | -1    | 0     | 0     | -1    | -1    | -1    |
|     | $r_{31}$ | 3     | -1    | -1    | -1    | -1    | -1    | 0     | 0     | -1    | -1    |
|     | $r_{32}$ | -1    | 1     | -1    | -1    | -1    | -1    | -1    | 0     | 0     | -1    |
|     | $r_{33}$ | -1    | -1    | 2     | -1    | -1    | -1    | -1    | -1    | 0     | 0     |

The rows $r_{11}$, $r_{12}$ and $r_{13}$ of the auxiliary protograph matrix P' are based on the row $r_1$ of the first protograph matrix $P_1$. The row $r_{21}$ of the auxiliary protograph matrix P' is based on the row $r_2$ of the first protograph matrix $P_1$. The rows $r_{31}$ and $r_{32}$ of the auxiliary protograph matrix P are based on the row $r_3$ of the first protograph matrix $P_1$.

The RS approach described above leads to a coherent first protograph matrix $P_1$ and to a coherent auxiliary protograph P', as well as to coherent corresponding LDPC codes. Indeed, since $r_i = \sum_j r_{ij}$, the rows in each layer of the auxiliary matrix P' (using the rule $(-1+k)=k$ and $(k+k)=-1$) can be summed and a matrix P''', which could be the same as P, can be obtained, if columns with zero weight, i.e. columns consisting of $-1$'s only, are excluded, wherein the matrix P''' is given by:

|      |       | $i_1$ | $i_2$ | $i_3$ | $p_1$ | $p_2$ | $p_3$ | $p_4$ | $p_5$ | $p_6$ | $p_7$ |
|------|-------|-------|-------|-------|-------|-------|-------|-------|-------|-------|-------|
| P'''=| $r_1$ | 2     | 4     | 1     | -1    | -1    | 0     | -1    | -1    | -1    | -1    |
|      | $r_2$ | 1     | -1    | 3     | -1    | -1    | 0     | 0     | -1    | -1    | -1    |
|      | $r_3$ | 3     | 1     | 2     | -1    | -1    | -1    | 0     | -1    | -1    | 0     |

In other words, if information bits $(i_1, i_2, i_3)$ are encoded with the LDPC code corresponding to the auxiliary protograph matrix P' resulting in a codeword $(i_1, i_2, i_3, p_1, p_2, p_3, p_4, p_5, p_6, p_7)$, then a subword $(i_1, i_2, i_3, p_3, p_4, p_7)$ is a codeword of the LDPC code corresponding to the protograph matrix $P_1$ with the same information bits $i_1, i_2, i_3$.

In embodiments of the invention, the raptor-like construction (RLC) algorithm can be used by the device 100 to generate the second protograph matrix $P_2$. In an embodiment, the processor 102 of the device 100 is configured to generate the second protograph matrix $P_2$ of size $(m+d) \times (n+d)$ with circulant size z on the basis of the auxiliary protograph matrix P of size $(m+d_1) \times (n+d_1)$ with circulant size z using the following RLC algorithm. In an embodiment, the first protograph matrix $P_1$ and/or the second protograph matrix $P_2$ are RA matrices.

Figure 5:
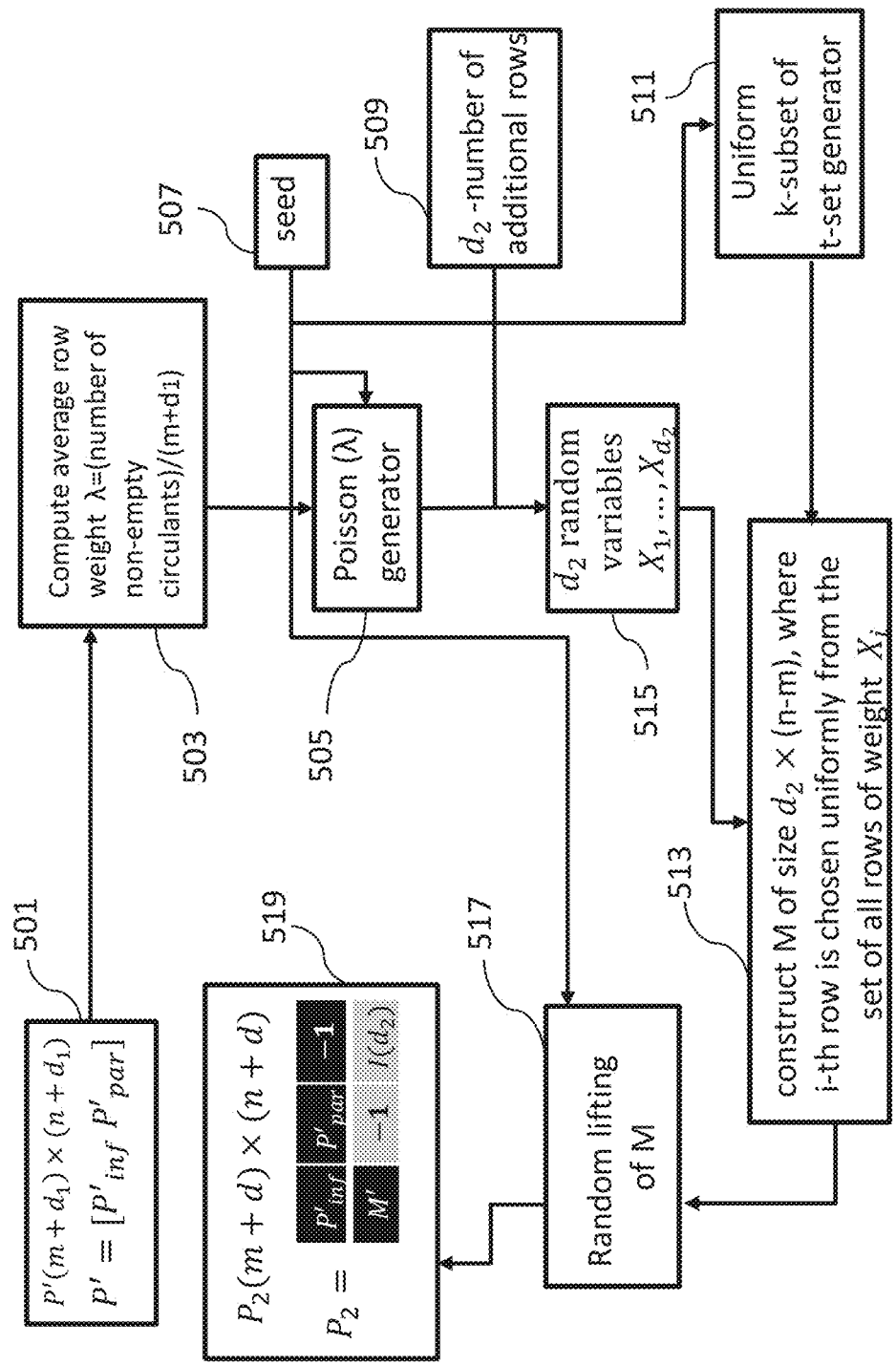
FIG. 5 shows a schematic diagram illustrating some steps of an algorithms for generating a matrix by a device for generating a code according to an embodiment.

In a first step of the RLC algorithm illustrated in FIG. 5, an average row weight of the auxiliary protograph matrix P' is computed (block 503), wherein the row weight is defined according to the following formula:

$$\lambda = \frac{\text{number of nonempty circulants in } P}{m + d_1},$$

wherein $m+d_1$ corresponds to the number of rows of the auxiliary protograph matrix P'.

In a further step of the RLC algorithm, a Poisson random number generator (PRNG) (block 505) having a mean value $\lambda$ is initialized with a seed seed (block 507).

In a further step of the RLC algorithm, $d_2$ random integer numbers $X_1, X_2, \ldots X_{d_2}$ (block 515) having a Poisson distribution are generated using the PRNG, wherein $d_2 = d - d_1$.

In a further step of the RLC algorithm, a uniform k-subset of t-set generator (U(k,t)) is initialized (block 511) with the seed seed.

In a further step of the RLC algorithm, a binary matrix M of size $d_2 \times (n-m)$ is constructed (block 513), wherein the i-th row of the binary matrix M can be considered as a subset of a (n-m)-set. For each $i \in d_2$, the i-th row of the binary matrix M is generated using $U(X_i, n-m)$.

In a further step of the RLC algorithm, a random number generator (RNG) taking values $[0, 1 \ldots z-1]$ is initialized with the seed seed. Furthermore, the binary matrix M is randomly lifted (block 517) on the basis of the RNG, i.e., instead of 1-s random circulant shift are put in the binary matrix M, and instead of 0-s, -1 are put in the binary matrix M. By randomly lifting the binary matrix M, a matrix M is obtained.

The outcome of the RLC algorithm is the second protograph matrix $P_2$ (block 519).

According to an embodiment of the invention, the second protograph matrix $P_2$ can be written as follows:

$$P_2 = \begin{array}{cc} P'_{inf} & P'_{par} & -1 \\ M' & -1 & I(d_2) \end{array}$$

wherein the auxiliary protograph matrix P' of size $(m+d_1) \times (n+d_1)$ (block 501) can be represented in the form $P' = [P'_{inf}\ P'_{par}]$, wherein $P'_{par}$ is a $(m+d_1) \times (m+d_1)$ matrix corresponding to the parity bits, $P_{inf}$ is a $(m+d_1) \times (n-m)$ matrix corresponding to the information bits, $I(d_2)$ is a $d_2 \times d_2$ matrix having zero circulant shifts as diagonal elements, and only empty circulant shifts as non-diagonal elements. Finally, -1 corresponds to the part of matrix containing only empty circulant shifts.

In embodiments of the invention, the second protograph matrix $P_2$ (block 519) can be represented in the following way: $P_2 = [P_{2,inf}\ P_{2,par}]$, wherein:

$$P_{2,inf} = \begin{array}{c} P'_{inf} \\ M' \end{array}$$

and $$P_{2,par} = \begin{array}{cc} P'_{par} & -1 \\ -1 & I(d_2) \end{array}$$

Since the matrix $I(d_2)$ has a diagonal form and $P'_{par}$ has an easy form for encoding, the second protograph matrix $P_2$ (block 519) can be used for easy (linear-time) encoding.

In order to better illustrate the above mentioned steps of the RS algorithm and of the RLC algorithm, we provide an exemplary first protograph matrix $P_1$ and a corresponding exemplary auxiliary matrix P' in FIG. 6, an exemplary binary matrix M and an exemplary lifted matrix M' in FIG. 7, and an exemplary second protograph matrix $P_2$ in FIG. 8.

$P_1$ is a first protograph matrix of size 3×6, specifically, m=3, n=6, and of circulant size z=10 (see FIG. 6). The matrix $P_1$ corresponds to the first transmission in a HARQ scheme. On the basis of the above described RS algorithm and RLC algorithm, a second protograph matrix $P_2$ of size 9×12, namely d=6, corresponding to a second transmission in HARQ scheme can be constructed.

Let $d_1$ be equal 3 (i.e., $d_1$=3 is the parameter chosen offline among all possible parameters which optimizes the performance of the code) and, therefore, $d_2$=d−$d_1$=3. By applying the RS algorithm to the first protograph matrix $P_1$, the resulting auxiliary protograph matrix P' can be obtained (see FIG. 6):

$$P'=RS(P_1,d_1).$$

In order to generate the second protograph matrix $P_2$ of size 9×12, a mean row weight λ of the auxiliary protograph matrix P' is computed:

$$\lambda = \frac{\text{number of nonempty circulants in } P'}{\text{number of rows in } P'} = \frac{20}{6} \approx 3,33.$$

Afterwards, $d_2$=3 random numbers $X_1$, $X_2$, and $X_3$ are generated by means of a seed seed and of a Poisson distribution $\wp$ having mean value λ, wherein a variable X has a Poisson distribution $\wp$, if:

$$\wp(X = k) = \frac{\lambda^k e^{-\lambda}}{k!},$$

wherein k is an integer number. For example, the Poisson random number generator gives the following result: $X_1$=3, $X_2$=4, and $X_3$=2.

Then, the binary matrix M of size 3×3 is generated using a uniform k-subset of a t-set random generator, wherein a random variable X with a uniform k-subset of a t-set distribution is defined as follows. Let A be a set of t elements, namely |A|=t. Then, for any B (subset of A), and |B|=k, the following probability distribution holds:

$$\mathcal{F}(X = B) = \frac{1}{\{t \text{ choose } k\}},$$

wherein {t choose k} corresponds to a binomial coefficient. Since, in embodiments of the invention, the weights of the new rows of the second protograph matrix $P_2$ are equal to $X_1$=3, $X_2$=4, and $X_3$=2, respectively, and the matrix I($d_2$) (also called raptor part) has row weights and column weights equal to 1, then, for constructing the binary matrix M, a 2-subset of a 3-set generator can be used to get the first row of the binary matrix M, a 3-subset of a 3-set generator can be used to get the second row of the binary matrix M, and a 1-subset of a 3-set generator can be used to get the third row binary matrix M (see FIG. 7).

Once the binary matrix M is generated, the matrix M can also be obtained (see FIG. 7) by randomly lifting the binary matrix M, i.e., instead of 1-s, random circulant shifts (not more than the circulant size 10) can be placed. Finally, the second protograph matrix $P_2$:

$$P_2=RLC(P',3,\text{seed}),$$

can be obtained (see FIG. 8), wherein the second protograph matrix $P_2$ has three more rows and three more columns than the auxiliary protograph matrix P'. Moreover, the weights of new rows of the second protograph matrix $P_2$ are equal to $X_1$=3, $X_2$=4, and $X_3$=2, respectively.

Advantageously, the specific form of the second protograph matrix $P_2$ allows to perform easy (linear time) encoding.

Figure 9:
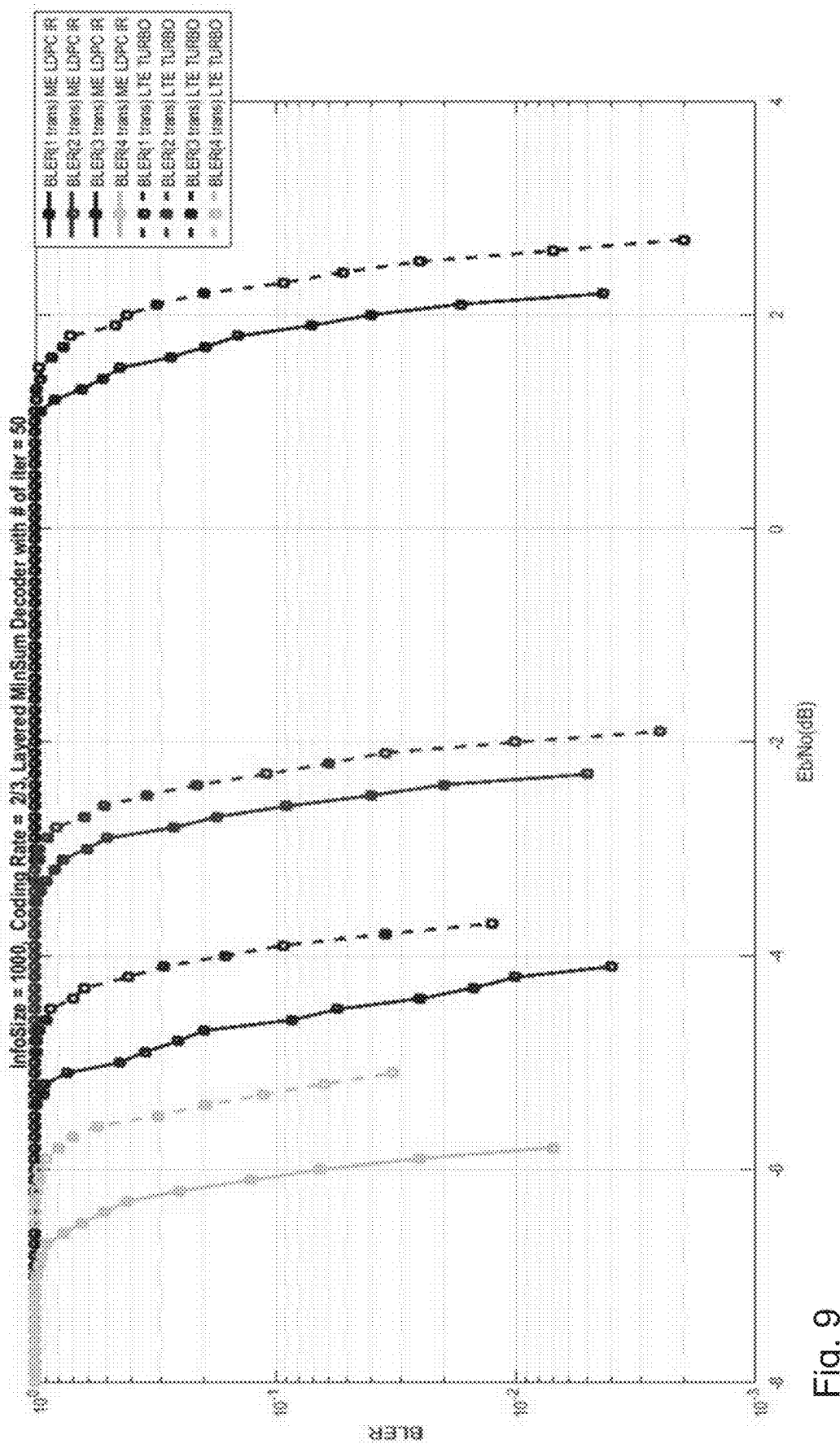
FIG. 9 shows a schematic diagram illustrating the performance of a HARQ communication apparatus according to an embodiment.
Figure 10:
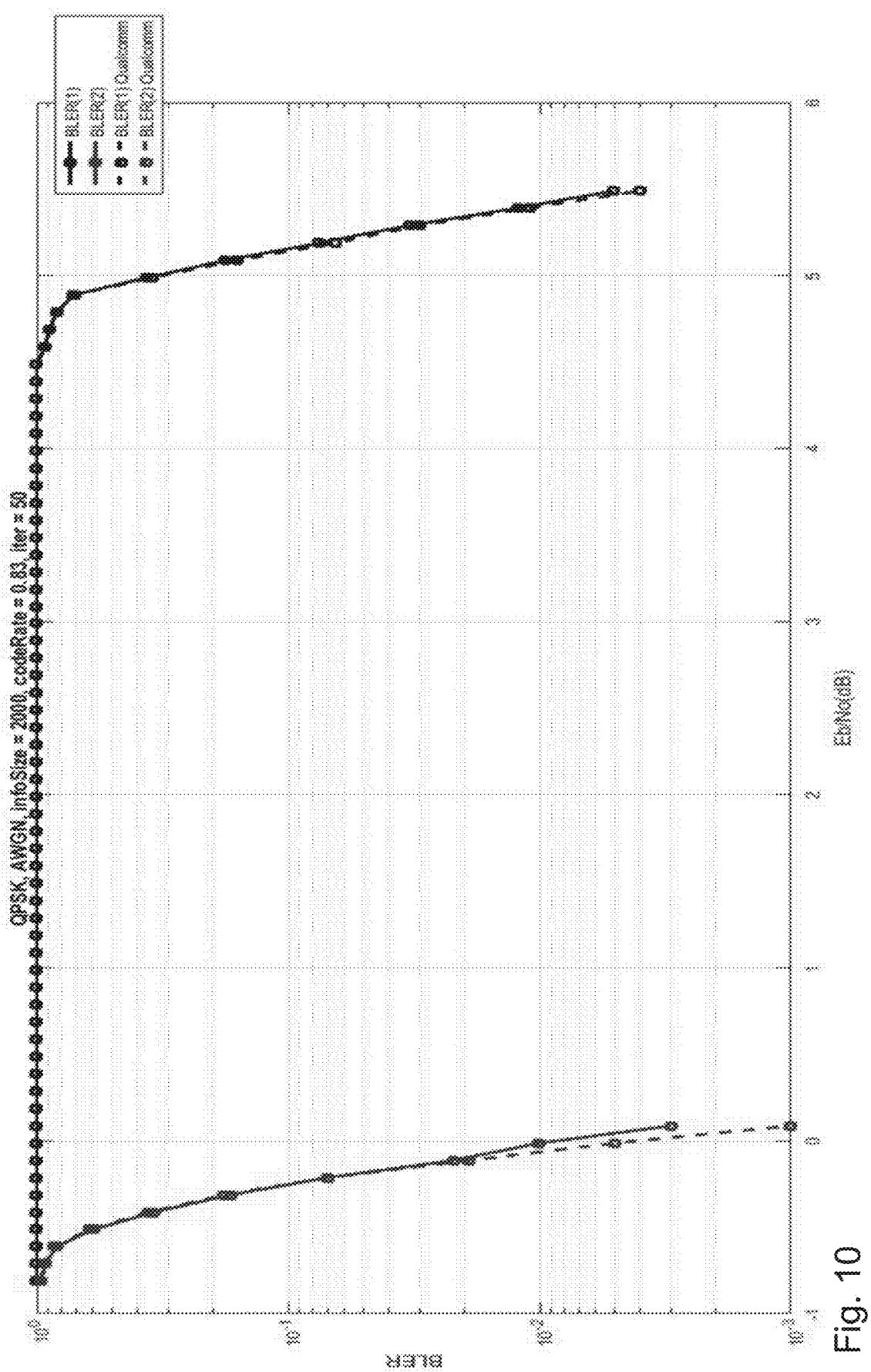
FIG. 10 shows a schematic diagram illustrating the performance of a HARQ communication apparatus according to an embodiment.

FIGS. 9 and 10 show a schematic diagram illustrating the performance of a HARQ communication apparatus 230 according to an embodiment. In this embodiment, the first protograph matrix $P_1$ used for the first transmission in HARQ scheme corresponds to a multi-edge protograph matrix of size 6×21, the coding rate is 3/4, the number of information bits is 2000, and the first protograph matrix $P_1$ contains 49 nonempty circulant shifts. For the 4-th transmission in HARQ scheme, the code is generated by a 66×81 fourth protograph matrix having 206 nonempty circulant shifts. For every circulant, the following bits can be stored: for each circulant shift value—9 bits, for its position in a corresponding protograph matrix: for rows and columns—7+7 bits for offline HARQ scheme, 5+5 for online HARQ scheme. Additional memory (less than or equal to 25 bits) for the seeds and the HARQ scheme parameters for online calculations can be taken into account. The total amount of memory for the offline storage of the protograph matrices in HARQ schemes is: 23×206=4738 bits, while the total amount of memory for the on-the-fly generation of the protograph matrices in the HARQ schemes according to embodiments of the invention is: 19×49+25=956 bits. In this example, we need 4.96 times less memory for matrix storage and HARQ parameters.

Furthermore, embodiments of the invention have a better performance (block error rate and throughput) than LTE HARQ schemes of different rates, and they also have a performance comparable to the one of offline HARQ schemes for LDPC codes. These results are also verified in different channel conditions, as shown in FIGS. 9 and 10.

In particular, FIG. 9 shows the block error rate (BLER) as a function of the signal to noise ration $E_b/N_0$ in dB of a communication apparatus, wherein the case ME LDPC IR (solid lines) refers to a multi-edge LDPC on-the-fly code used in HARQ schemes according to embodiment of the present invention which is compared to a LTE TURBO code with 8 iterations and scaled Max Log MAP decoding (scale factor=0.75 for all iterations) used in HARQ schemes. By way of example, a CRC of length 24, a code rate equal to 2/3, a number of transmissions equal to 4, a QPSK modulation, an additive white Gaussian noise (AWGN) channel, and an information length of 1000 bits are chosen. Moreover, the number of iteration of the layered min-sum decoder or communication apparatus for the LDPC code simulation is set to 50. As it can be taken from FIG. 9, for the same value of $E_b/N_0$, the BLER in the ME LDPC IR cases (solid lines) is much lower than in the other cases. Therefore, the performance of the LDPC on-the-fly code used in HARQ schemes according to embodiments of the present invention is significantly higher compared to the performance of other codes used in HARQ schemes.

In FIG. 10, the performance of a multi-edge LDPC offline HARQ scheme proposed by Qualcomm is compared to the performance of a multi-edge LDPC on-the-fly HARQ scheme according to embodiments of the present invention. In this embodiment, a code of rate 0.83, a number of transmissions equal to 2, a QPSK modulation, an AWGN channel, an information length of 2000 bits, and a number of iteration of layered min-sum decoder for LDPC simulation of 50 are chosen.

Some advantages of embodiments of the device 100 for generating on-the-fly LDPC matrices for HARQ schemes according to embodiment of the invention include: very good performance (similar to the one of offline HARQ schemes and better than the one of LTE TURBO schemes), saving memory for the matrix storage (only seeds and parameters for the row-splitting algorithm are kept in the memory), and a low complexity of constructing extended codes (they are linear on the number of nonempty circulant shifts). Therefore, embodiments of the present invention can be realized in real time systems.

Figure 11:
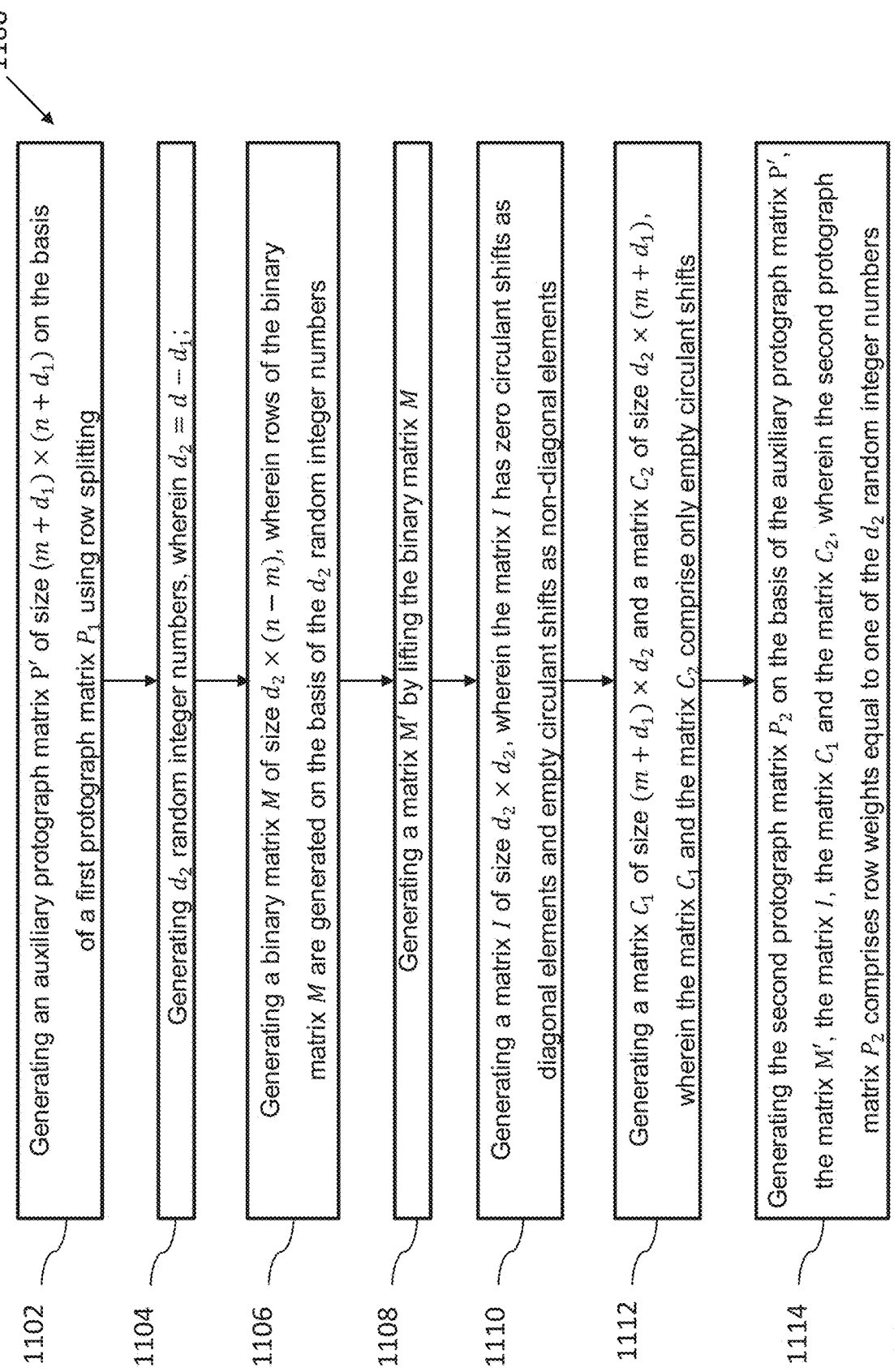
FIG. 11 shows a schematic diagram illustrating a method for generating a code for a HARQ communication apparatus according to an embodiment.

FIG. 11 shows a schematic diagram illustrating a method 1100 for generating a code for a HARQ communication apparatus 210, wherein the method 1100 generates on the basis of a first protograph matrix $P_1$ of size m×n, wherein the first protograph matrix $P_1$ defines a first code $H_1$, a second protograph matrix $P_2$ of size (m+d)×(n+d), wherein the second protograph matrix $P_2$ defines a second code $H_2$. The method 1100 comprises the following steps: generating 1102 an auxiliary protograph matrix P' of size $(m+d_1)\times(n+d_1)$ on the basis of the first protograph matrix $P_1$ using row splitting; generating 1104 $d_2$ random integer numbers, wherein $d_2=d-d_1$; generating 1106 a binary matrix M of size $d_2\times(n-m)$, wherein rows of the binary matrix M' are generated on the basis of the $d_2$ random integer numbers; generating 1108 a matrix M' by lifting the binary matrix M;

generating 1110 a matrix I of size $d_2\times d_2$, wherein the matrix I has zero circulant shifts as diagonal elements and empty circulant shifts as non-diagonal elements; generating 1112 a matrix $C_1$ of size $(m+d_1)\times d_2$ and a matrix $C_2$ of size $d_2\times(m+d_1)$, wherein the matrix $C_1$ and the matrix $C_2$ comprise only empty circulant shifts; and generating 1114 the second protograph matrix $P_2$ on the basis of the auxiliary protograph matrix P', the matrix M', the matrix I, the matrix $C_1$ and the matrix $C_2$, wherein the second protograph matrix $P_2$ comprises row weights equal to one of the $d_2$ random integer numbers.

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

What is claimed is:

1. A device for generating on the basis of a first protograph matrix $P_1$ of size m×n, wherein the first protograph matrix $P_1$ defines a first low-density parity-check (LDPC) code $H_1$ and corresponds to a first transmission in a hybrid automatic repeat request (HARQ) transmission, a second protograph matrix $P_2$ of size (m+d)×(n+d), wherein the second protograph matrix $P_2$ defines a second LDPC code $H_2$ and corresponds to a second transmission in the HARQ transmission, wherein m, n and d are positive integers and m<n, wherein the device comprises:

a processor configured to:
  generate an auxiliary protograph matrix P' of size $(m+d_1)\times(n+d_1)$ on the basis of the first protograph matrix $P_1$ using row splitting, wherein $d_1$ is a positive integer and $d_1<d$;
  generate $d_2$ random integer numbers, wherein $d_2=d-d_1$ and $d_2$ is a positive integer;
  generate a binary matrix M of size $d_2\times(n-m)$, wherein rows of the binary matrix M are generated on the basis of the $d_2$ random integer numbers;
  generate a matrix M' by lifting the binary matrix M;
  generate a matrix I of size $d_2\times d_2$, wherein the matrix I has zero circulant shifts as diagonal elements and empty circulant shifts as non-diagonal elements;
  generate a matrix $C_1$ of size $(m+d_1)\times d_2$ and a matrix $C_2$ of size $d_2\times(m+d_1)$, wherein the matrix $C_1$ and the matrix $C_2$ comprise only empty circulant shifts; and
  generate the second protograph matrix $P_2$ on the basis of the auxiliary protograph matrix P', the matrix M', the matrix I, the matrix $C_1$ and the matrix $C_2$, wherein the second protograph matrix $P_2$ comprises row weights equal to one of the $d_2$ random integer numbers;

an encoder configured to encode a binary information sequence with attached cyclic redundancy check (CRC) by using the second LDPC code $H_2$ to obtain a codeword for the second transmission; and a transmitter configured to transmit a part of the codeword for the second transmission, wherein the remaining part of the codeword corresponds to the first LDPC code $H_1$.

2. The device of claim 1, wherein the processor is further configured to generate the $d_2$ random integer numbers on the basis of a mean row weight λ of the auxiliary protograph matrix P', wherein the mean row weight λ is defined as a ratio of the number of nonempty circulants of the auxiliary matrix P' to $(m+d_1)$.

3. The device of claim 2, wherein the processor is further configured to generate the $d_2$ random integer numbers on the basis of a Poisson distribution having a mean value λ.

4. The device of claim 1, wherein the auxiliary protograph matrix P' has a circulant size z and z is a positive integer, and wherein the processor is further configured to generate at most z random circulant shifts on the basis of a seed, wherein the z random circulant shifts have integer values lower than z or equal to z.

5. The device of claim 4, wherein the processor is further configured to lift the binary matrix M by replacing elements of the binary matrix M equal to 1 by one of the z random circulant shifts and by replacing the elements of the binary matrix M equal to 0 by −1.

6. The device of claim 1, wherein the processor is further configured to set the elements ($1:m+d_1$, $1:n+d_1$) of the second protograph matrix $P_2$ equal to the corresponding elements of the auxiliary protograph matrix P'.

7. The device of claim 1, wherein the processor is further configured to set the elements ($1:m+d_1$, $n+d_1+1:n+d$) of the second protograph matrix $P_2$ equal to the corresponding elements of the matrix $C_1$.

8. The device of claim 1, wherein the processor is further configured to set the elements ($m+d_1+1:m+d$, $1:n-m$) of the second protograph matrix $P_2$ equal to the corresponding elements of the matrix M'.

9. The device of claim 1, wherein the processor is further configured to set the elements ($m+d_1+1:m+d$, $n-m+1:n+d_1$) of the second protograph matrix $P_2$ equal to the corresponding elements of the matrix $C_2$.

10. The device of claim 1, wherein the processor is further configured to set the elements ($m+d_1+1:m+d$, $n+d_1+1:n+d$) of the second protograph matrix $P_2$ equal to the corresponding elements of the matrix I.

11. The device of claim 1, wherein at least one of the first protograph matrix $P_1$, the auxiliary protograph matrix P' and the second protograph matrix $P_2$ have the same circulant size.

12. A method for generating on the basis of a first protograph matrix $P_1$ of size m×n, wherein the first protograph matrix $P_1$ defines a first low-density parity-check (LDPC) code $H_1$ and corresponds to a first transmission in a hybrid automatic repeat request (HARQ) transmission, a second protograph matrix $P_2$ of size (m+d)×(n+d), wherein the second protograph matrix $P_2$ defines a second LDPC code $H_2$ and corresponds to a second transmission in the HARQ transmission, wherein m, n and d are positive integers and m<n, wherein the method comprises:

generating an auxiliary protograph matrix P' of size ($m+d_1$)×($n+d_1$) on the basis of the first protograph matrix $P_1$ using row splitting, wherein $d_1$ is a positive integer and $d_1<d$;

generating $d_2$ random integer numbers, wherein $d_2=d-d_1$ and $d_2$ is a positive integer;

generating a binary matrix M of size $d_2$×(n−m), wherein rows of the binary matrix M are generated on the basis of the $d_2$ random integer numbers;

generating a matrix M' by lifting the binary matrix M;

generating a matrix I of size $d_2 \times d_2$, wherein the matrix I has zero circulant shifts as diagonal elements and empty circulant shifts as non-diagonal elements;

generating a matrix $C_1$ of size ($m+d_1$)×$d_2$ and a matrix $C_2$ of size $d_2$×($m+d_1$), wherein the matrix $C_1$ and the matrix $C_2$ comprise only empty circulant shifts;

generating the second protograph matrix $P_2$ on the basis of the auxiliary protograph matrix P', the matrix M', the matrix I, the matrix $C_1$ and the matrix $C_2$, wherein the second protograph matrix $P_2$ comprises row weights equal to one of the $d_2$ random integer numbers;

encoding a binary information sequence with attached cyclic redundancy check (CRC) by using the second LDPC code $H_2$ to obtain a codeword for the second transmission; and transmit a part of the codeword for the second transmission, wherein the remaining part of the codeword corresponds to the first LDPC code $H_1$.

13. The method of claim 12, wherein the method further comprises the step of: generate the $d_2$ random integer numbers on the basis of a mean row weight λ of the auxiliary protograph matrix P', wherein the mean row weight λ is defined as a ratio of the number of nonempty circulants of the auxiliary matrix P' to ($m+d_1$).

14. The method of claim 12, wherein the auxiliary protograph matrix P' has a circulant size z and z is a positive integer, and wherein the method further comprises the step of: generate at most z random circulant shifts on the basis of a seed, wherein the z random circulant shifts have integer values lower than z or equal to z.

15. The method of claim 12, wherein the method further comprises the step of: setting the elements ($1:m+d_1$, $1:n+d_1$) of the second protograph matrix $P_2$ equal to the corresponding elements of the auxiliary matrix P'.

16. The method of claim 12, wherein the method further comprises the step of: setting the elements ($1:m+d_1$, $n+d_1+1:n+d$) of the second protograph matrix $P_2$ equal to the corresponding elements of the matrix $C_1$.

17. The method of claim 12, wherein the method further comprises the step of: setting the elements ($m+d_1+1:m+d$, $1:n-m$) of the second protograph matrix $P_2$ equal to the corresponding elements of the matrix M'.

18. The method of claim 12, wherein the method further comprises the step of: setting the elements ($m+d_1+1:m+d$, $n-m+1:n+d_1$) of the second protograph matrix $P_2$ equal to the corresponding elements of the matrix $C_2$.

19. The method of claim 12, wherein the method further comprises the step of: setting the elements ($m+d_1+1:m+d$, $n+d_1+1:n+d$) of the second protograph matrix $P_2$ equal to the corresponding elements of the matrix I.

20. A computer program product, comprising computer executable instructions stored on a non-transitory computer-readable medium, wherein when the instructions are executed by a processor, causes the processor to perform steps comprising generating an auxiliary protograph matrix P' of size ($m+d_1$)×($n+d_1$) on the basis of the first protograph matrix $P_1$ using row splitting, wherein m, n and $d_1$ are positive integers and m<n, and wherein the first protograph matrix $P_1$ defines a first low-density parity-check (LDPC) code $H_1$ and corresponds to a first transmission in a hybrid automatic repeat request (HARQ) transmission;

generating $d_2$ random integer numbers, wherein $d_2=d-d_1$, d and $d_2$ are positive integers, and $d_1<d$;

generating a binary matrix M of size $d_2$×(n−m), wherein rows of the binary matrix M are generated on the basis of the $d_2$ random integer numbers;

generating a matrix M' by lifting the binary matrix M;

generating a matrix I of size $d_2 \times d_2$, wherein the matrix I has zero circulant shifts as diagonal elements and empty circulant shifts as non-diagonal elements;

generating a matrix $C_1$ of size ($m+d_1$)×$d_2$ and a matrix $C_2$ of size $d_2$×($m+d_1$), wherein the matrix $C_1$ and the matrix $C_2$ comprise only empty circulant shifts;

generating the second protograph matrix $P_2$ on the basis of the auxiliary protograph matrix P', the matrix M', the matrix I, the matrix $C_1$ and the matrix $C_2$, wherein the second protograph matrix $P_2$ comprises row weights equal to one of the $d_2$ random integer numbers, and wherein the second protograph matrix $P_2$ defines a second LDPC code $H_2$ and corresponds to a second transmission in the HARQ transmission;

encoding a binary information sequence with attached cyclic redundancy check (CRC) by using the second LDPC code $H_2$ to obtain a codeword for the second transmission; and transmitting a part of the codeword for the second transmission, wherein the remaining part of the codeword corresponds to the first LDPC code $H_1$.

\* \* \* \* \*